United States Patent [19]
Chang

[11] Patent Number: 6,043,121
[45] Date of Patent: Mar. 28, 2000

[54] METHOD FOR FABRICATING AN ONE-TIME PROGRAMMABLE READ ONLY MEMORY

[75] Inventor: Kuang-Yeh Chang, Taipei, Taiwan

[73] Assignee: United Microelectronics Corp., Hsinchu, Taiwan

[21] Appl. No.: 09/094,003

[22] Filed: Jun. 9, 1998

[30] Foreign Application Priority Data

Apr. 13, 1998 [TW] Taiwan ................................. 87105526

[51] Int. Cl.$^7$ ............................................... A01L 21/8247
[52] U.S. Cl. ............................................ 438/257; 438/262
[58] Field of Search ..................................... 438/257–267

[56] References Cited

U.S. PATENT DOCUMENTS

| | | |
|---|---|---|
| 5,532,181 | 7/1996 | Takebuchi et al. |
| 5,646,888 | 7/1997 | Mori .................................. 365/185.33 |
| 5,666,311 | 9/1997 | Mori ....................................... 438/257 |
| 5,930,628 | 7/1999 | Chang ..................................... 438/258 |
| 5,946,230 | 8/1999 | Shimizu et al. .................... 365/185.01 |

*Primary Examiner*—Richard Booth
*Attorney, Agent, or Firm*—Thomas, Kayden, Horstemeyer & Risley

[57] ABSTRACT

A method for fabricating an OTP-ROM includes a first polysilicon layer formed over a semiconductor substrate. An ion implanting process is performed to form a diffusion region inside the substrate on both sides of the first polysilicon layer. This diffusion region acts as a bit line. Then, a second polysilicon layer is formed to cover the first polysilicon layer. The second polysilicon layer is patterned to form a control gate. The patterning process is continued to further pattern the first polysilicon layer to form a floating gate.

13 Claims, 4 Drawing Sheets

METHOD FOR FABRICATING AN ONE-TIME PROGRAMMABLE READ ONLY MEMORY

CROSS-REFERENCE TO RELATED APPLICATION

This application claims the priority benefit of Taiwan application Ser. No. 87105526, filed Apr. 13, 1998, the full disclosure of which is incorporated herein by reference.

BACKGROUND OF THE INVENTION

1. Field of the Invention

This invention relates to a memory device structure, and more particularly to an one-time programmable read-only memory (OTP-ROM) structure.

2. Description of Related Art

When microprocessor functions increase, software program size and computation ability increase accordingly, so that more and more memory capacity is needed. Therefore, the question of how to make a cheaper memory device with a larger capacity to satisfy these needs is an important issue for semiconductor manufacturers. Memory is classified into two different types according to function. These types are read-only memory (ROM) and random access memory (RAM). A ROM device can only read, while a RAM device can both read and write. A ROM device can be further classified into a few categories such as a mask ROM device, a programmable ROM (PROM) device, an erasable programmable ROM (EPROM) and an electrically erasable programmable ROM (EEPROM). Similarly, the RAM device can be classified into two categories: static RAM (SRAM) and dynamic RAM (DRAM).

ROM devices have been widely used in minicomputers and microprocessors, in which they are used to store system information such as a resident program of a basic input/output system. Since the procedure for fabricating a ROM device is quite complicated and consumes time in order to process and treat materials used, customers usually provide the desired program codes for manufacturers to store the codes into the ROM devices, which then the products.

Aside from the difference in the stored programs, ROM device structures are the same. Because of this, ROM devices can be partially fabricated, up to the stage before the program codes are to be stored. Thus, manufacturers can massively produce partially-fabricated, unprogrammed ROM devices, and then wait for the orders from customers. When customers place their order, the program codes are stored by rapid fabrication of photo masks. The final products, then, can be distributed to the customers in a short time. Manufacturers usually adopt this strategy of post-programming by photo-mask.

In general, a ROM uses a channeled transistor as a memory cell. While performing the programming process, the channels are selectively implanted with ions in order to change the threshold voltage to behave as either "on" or "off", according to the program codes. The ROM device includes a number of memory cells arranged in an array. A set of word lines and bit lines are connected to the gates and the drains of each memory cells, respectively. The word lines cross over the bit lines. The channels of memory cells for memory function are formed under the word line made of polysilicon and between bit lines so that the memory cells can store a binary data of "0" or "1", which is respectively determined by whether a channel is implanted or not.

FIG. 1 is a schematic layout of a conventional programmable ROM device. FIG. 2 is a schematic cross sectional view taken along the line I—I in FIG. 1. FIG. 3 is a schematic cross sectional view taken along the line II—II in FIG. 1.

Referring to FIGS. 1–3, a thermal oxidation process is performed on a semiconductor substrate 10 to form an oxide layer (not shown) on it. Then, a field oxide layer 14 is formed on the substrate 10 to pattern an active region, which is the portion not occupied by the field oxide layer 14 and usually appears after a planarization process. Then, the oxide layer (not shown) is removed by, for example, wet etching. Next, a thermal oxidation process is performed to a thermal oxide layer 12. Then polysilicon material is deposited over the thermal oxide layer 12 by low pressure chemical vapor deposition (LPCVD) to form a polysilicon layer 16, which is patterned by photolithography and etching.

Next, an inter-poly dielectric layer 18, which includes polysilicon, is formed by, for example, LPCVD. LPCVD is also used to form another polysilicon layer 20 over the inter-poly dielectric layer 18. Both the inter-poly dielectric layer 18 and the polysilicon layer 20 are patterned by photolithography and etching. Then, by using the polysilicon layer 20 as a mask, the polysilicon layer 16 is further patterned to have a structure as schematically shown with two sectional views in FIG. 2 and FIG. 3.

A process of implanting ions is next performed by using the polysilicon layer 20 as a mask to form a diffusion region 22 with a higher density of doped ions than the substrate's 10. Then, for example, by LPCVD, a dielectric layer 24 is deposited over the substrate 10, but with a contact window 26 being patterned to expose the diffusion region 22. Then, a metal layer 28 acting as a bit line 28 is formed over the dielectric layer 24 by LPCVD, filling the contact widow 26 so that the metal layer 28, also known as the bit line 28, is electrically coupled to the diffusion region 22. A conventional procedure is followed to complete fabrication of a PROM. This procedure is familiar to those skilled in the art and therefore is not described here.

In the conventional method described above, it is difficult to effectively reduce PROM size because it is limited by the contact window. The existence of the field oxide layer 14 also affects the size reduction and planarization of the active region. Besides that, since the metal layer 28 also has to fill the contact window 26 in order to serve as the bit line, interference due to signal reflection from the metal layer 28 is inevitable.

In another conventional PROM, a buried bit line under a field oxide layer still cannot effectively reduce size or improve the quality of planarization, because of the continuing presence of the field oxide layer. Furthermore, when patterning is performed by, for example, dry etching, since the vertical depth to be etched is not uniform, some regions can be too thick or too thin, and it is difficult to properly control etching time. Moreover, the buried bit line under the field oxide layer has a higher resistance than a normal one and therefore cannot be formed in a self-aligned process.

SUMMARY OF THE INVENTION

It is therefore an objective of the present invention to provide an one-time programmable read-only memory (OTP-ROM) that solves the conventional problems. A self-aligned technology is used to form a buried bit line so that there is no need for extra masks and processes to form and fill the contact window. Because of this, interference caused by signal reflection from the metal in the contact window is avoided. Furthermore, there is no need to form a field oxide layer in the invention, the planarization of the active region can be improved and the size can be effectively reduced.

In accordance with the foregoing and other objectives of the present invention, a method for fabricating the OTP-ROM includes a first polysilicon layer formed over a semiconductor substrate. An ion implanting process is performed to form a diffusion region inside the substrate on both sides of the first polysilicon layer. This diffusion area acts as a bit line. Then, a second polysilicon layer is formed to cover the first polysilicon layer. The second polysilicon layer is patterned to form a control gate. The patterning process is continued to further pattern the first polysilicon layer, which forms a floating gate.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

Figure 1:
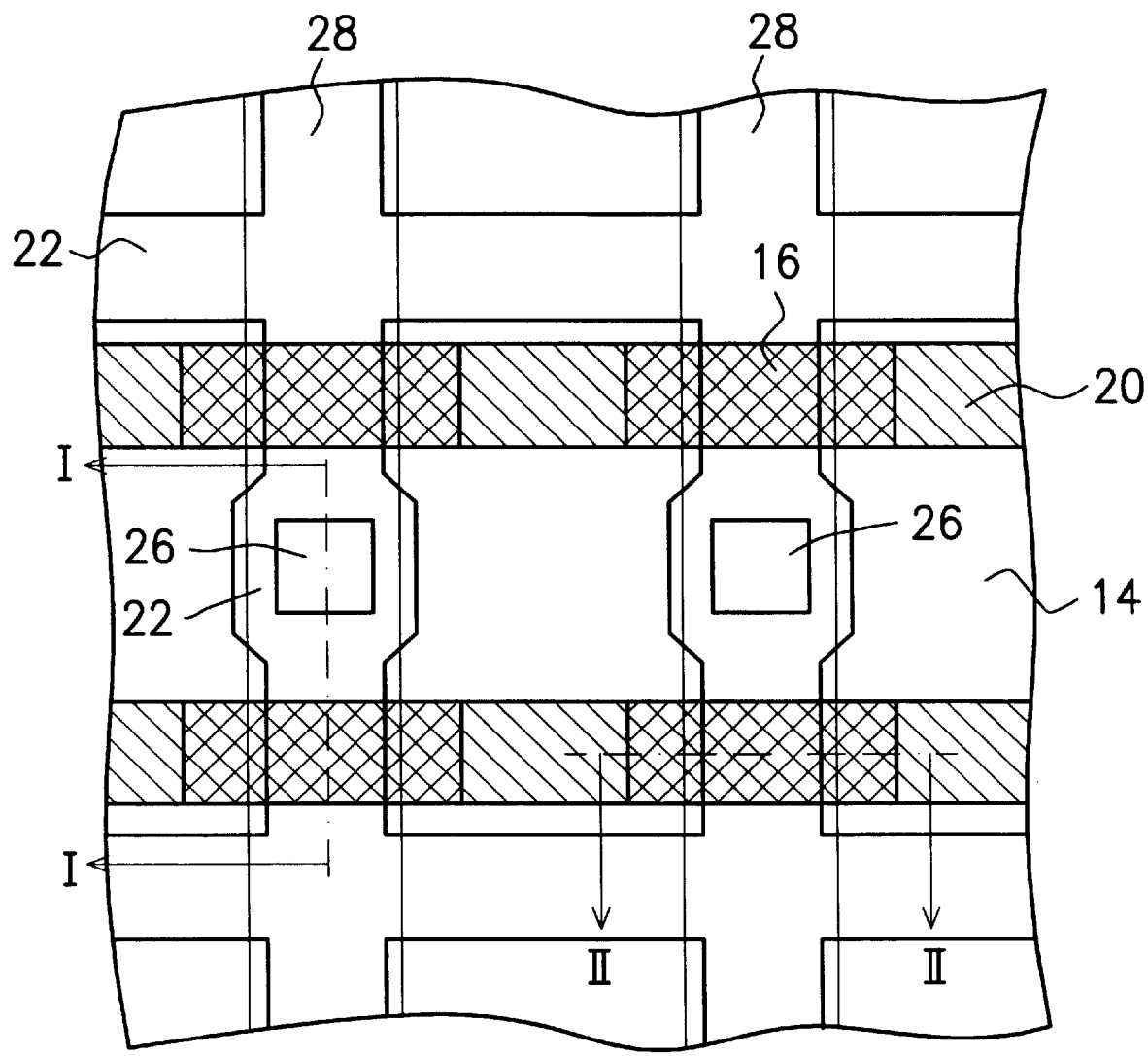
FIG. 1 is a schematic layout of a conventional programmable ROM device.
Figure 2:
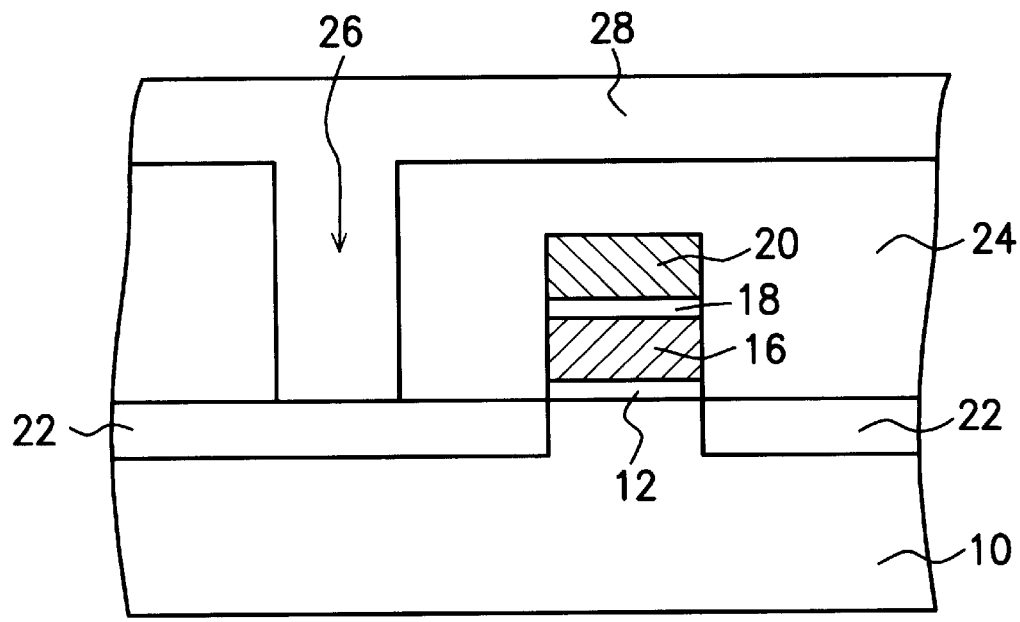
FIG. 2 is a schematic cross sectional view taken along the line I—I in FIG. 1.
Figure 3:
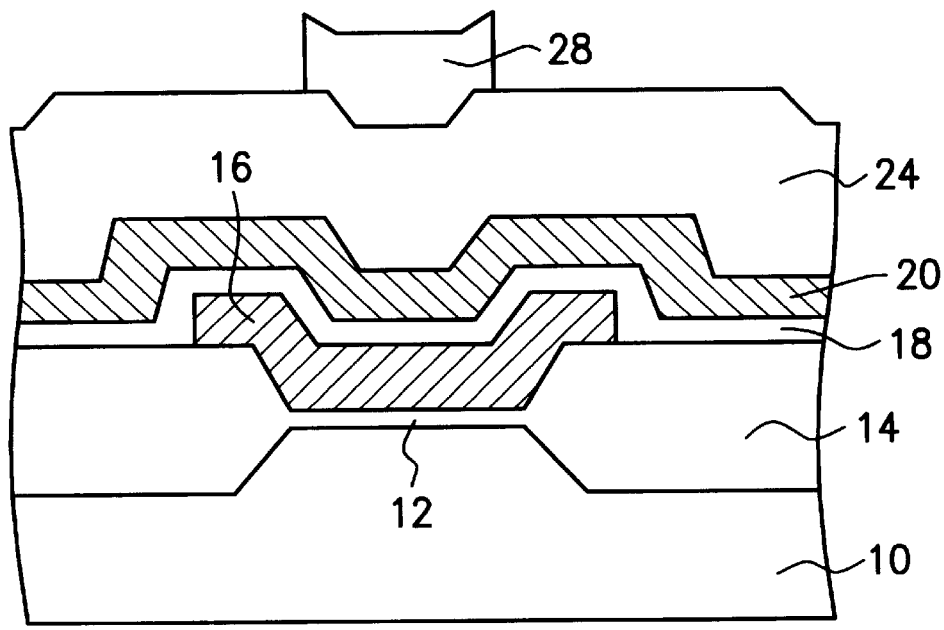
FIG. 3 is a schematic cross sectional view taken along the line II—II in FIG. 1.
Figure 4:
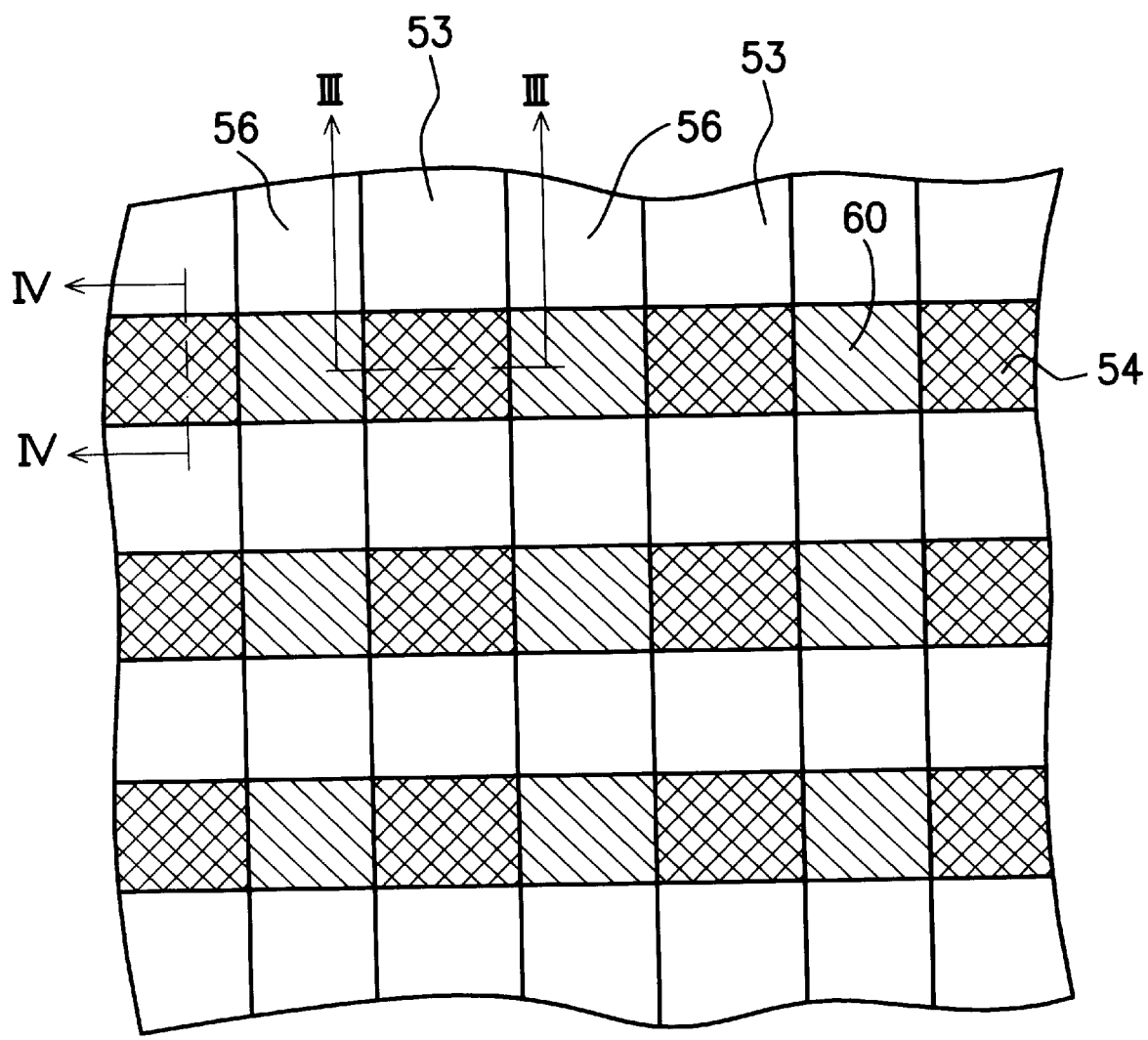
FIG. 4 is a schematic layout of a programmable ROM device according to the preferred embodiment of the invention.
Figure 5A:
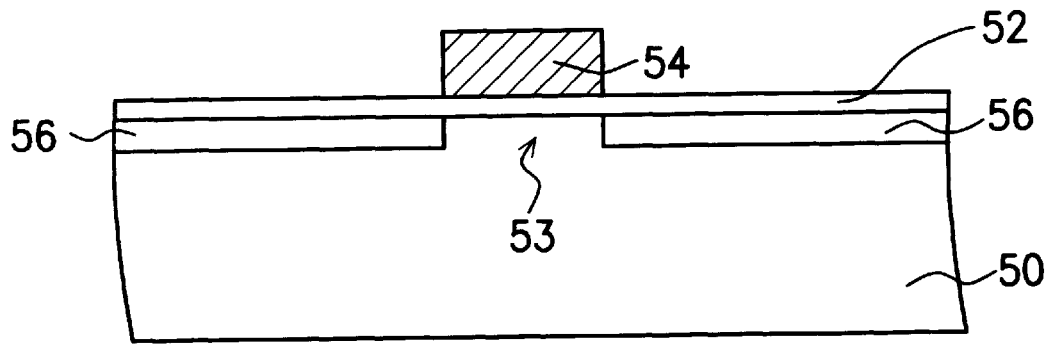
FIGS. 5A–5B are cross sectional views taken along the line III—III in FIG. 4 schematically illustrating the fabrication procedure.
Figure 5B:
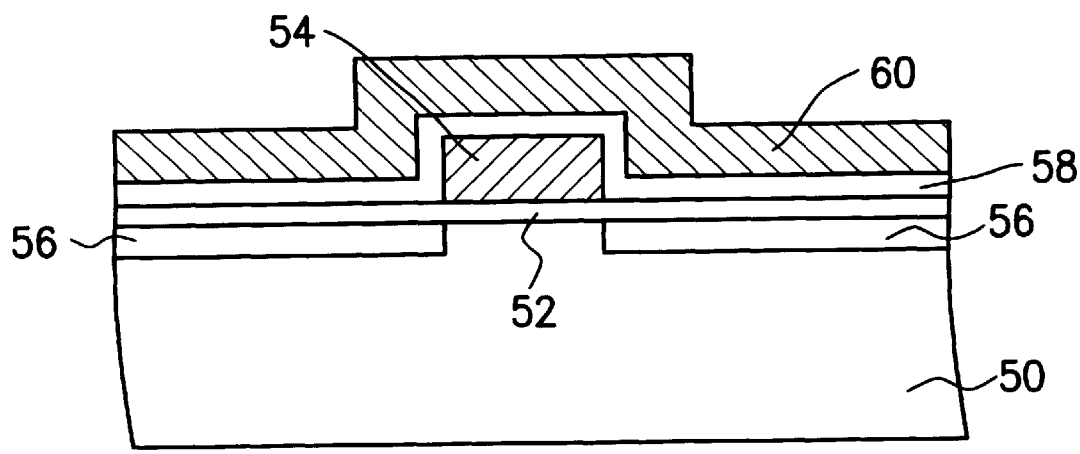
Figure 5C:
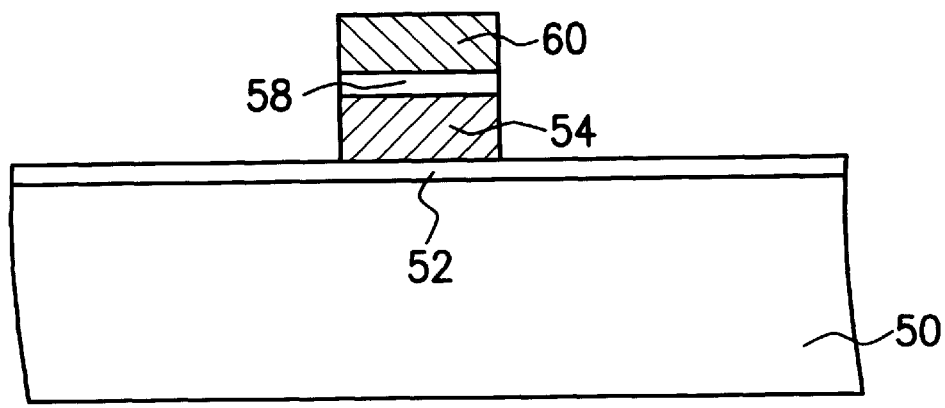
FIG. 5C is cross sectional view taken along the line IV—IV in FIG. 4 schematically illustrating the fabrication procedure.

FIG. 4 is a schematic layout of a programmable ROM device according to the preferred embodiment of the invention. FIGS. 5A–5B are cross sectional views taken along the line III—III in FIG. 4 schematically illustrating the fabrication procedure. FIG. 5C is cross sectional view taken along the line IV—IV in FIG. 4 schematically illustrating the fabrication procedure.

Referring to FIG. 4 and FIG. 5A, a thermal oxidation process is performed on a semiconductor substrate 50 to form a thermal oxide layer 52. Then, polysilicon material is deposited over the substrate 50 by LPCVD and is patterned by photolithography and etching to form a polysilicon layer 54 on the thermal oxide layer 52. A strip-like channel 53 is, therefore, formed under the polysilicon layer 54 in FIG. 5A.

Then, an ion implanting process involved in a self-aligned technology is performed to implant ions through the thermal oxide layer 52 into the substrate 50 on both sides of the polysilicon layer 54. Immediately after that, an annealing process is performed to form a diffusion region 56 with a strip-like structure. The diffusion region 56 is used for a buried bit line 56. This is one of the characteristics of the invention.

Referring to FIG. 5B an inter-poly dielectric layer 58, for example, covers the polysilicon 54 and the thermal oxide layer 52 by LPCVD inter-poly dielectric layer 58. This is a oxide/nitride/oxide (ONO) structure. Then, a polysilicon layer 60 is formed by LPCVD on the inter-poly dielectric layer 58.

Referring to FIG. 5C, in another sectional view taken along the line IV—IV in FIG. 4, the polysilicon layer 60 is patterned into a strip-like structure to serve as a control gate 60, which also acts as a word line 60, by photolithography and etching. Therefore, the polysilicon layer 60, also known as the word line, lies in a direction substantially vertical to the diffusion region 56, which is used for bit line. The PROM, therefore, is an array structure. Then, the inter-poly dielectric layer 58 and the polysilicon layer 54 are further patterned by self-aligned etching to form a structure such as the control gate 60 in the sectional view taken along line IV—IV of FIG. 4. Thus, the polysilicon layer 54 serves as a floating gate. A conventional procedure is followed to complete fabrication of a PROM. This procedure is familiar to those skilled in the art and therefore is not described here.

In conclusion, the invention uses an ion implanting process in a self-aligned technology, by using the polysilicon layer 54 as a mask to form a buried bit line 56. The contact window is unnecessary and interference from the signal reflection of metal in the contact window is avoided.

Moreover, since the field oxide layer is unnecessary in this invention, the size is greatly reduced and a higher quality of planarization of the active region is achieved.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A method for fabricating an one-time programmable read-only memory (OTP-ROM) on a semiconductor substrate, the method comprising:

forming an oxide layer over the substrate;

forming a first polysilicon layer over the oxide layer;

patterning the first polysilicon layer to expose a portion of the oxide layer;

implanting ions in the exposed portion of the oxide layer to form a diffusion region on the substrate;

forming a dielectric layer to cover the first polysilicon layer and the oxide layer;

forming a second polysilicon layer to cover the dielectric layer; and patterning the second polysilicon layer to form a control gate and further patterning the first polysilicon layer to form a floating gate of said one-time programmable read-only memory.

2. The method of claim 1, wherein the diffusion region, in the ion implantation in the exposed portion of the oxide layer step, is a buried bit line.

3. The method of claim 1, wherein the step of forming the first polysilicon layer comprises low pressure chemical vapor deposition.

4. The method of claim 1, wherein the step of patterning the first polysilicon layer comprises photolithography and etching.

5. The method of claim 1, wherein the ion implantation in the exposed potion of the oxide layer comprises use of the first polysilicon layer as a mask.

6. The method of claim 1, wherein the ion implantation in the exposed portion of the oxide layer comprises self-alignment.

7. The method of claim 1, wherein the step of forming the dielectric layer comprises a low pressure chemical vapor deposition (LPCVD).

8. The method of claim 1, wherein forming the second polysilicon layer comprises low pressure chemical vapor deposition.

9. The method of claim 1, wherein forming the second polysilicon layer comprises photolithography and etching.

10. The method of claim 1, wherein patterning the second polysilicon layer comprises a patterning on the dielectric layer.

11. The method of claim 1, wherein patterning the first polysilicon layer further comprises self-aligned etching for patterning by use of the second polysilicon layer as a mask.

12. The method of claim 1, wherein in patterning the second polysilicon layer, further patterning the first polysilicon layer comprises photolithography and etching.

13. The method of claim 1, wherein in patterning the second polysilicon layer, further patterning the first polysilicon layer comprises self-aligned etching.

* * * * *